US010257910B2

(12) United States Patent
Zheng (10) Patent No.: US 10,257,910 B2
(45) Date of Patent: Apr. 9, 2019

(54) OPTICAL MODULE (71) Applicants: Hisense Broadband Multimedia Technologies Co., Ltd., Qingdao, Shandong (CN); Hisense Broadband Multimedia Technologies, Ltd., Tortola (VG)

(72) Inventor: Long Zheng, Shandong (CN)

(73) Assignees: Hisense Broadband Multimedia Technologies Co., Ltd., Qingdao, Shandong (CN); Hisense Broadband Multimedia Technologies, Ltd., Tortola (VG)

( * ) Notice: Subject to any disclaimer, the term of this patent is extended or adjusted under 35 U.S.C. 154(b) by 0 days.

(21) Appl. No.: 15/857,855

(22) Filed: Dec. 29, 2017

(65) Prior Publication Data
US 2018/0294885 A1 Oct. 11, 2018

(30) Foreign Application Priority Data

Apr. 6, 2017 (CN) .......................... 2017 1 0220900
May 17, 2017 (CN) .......................... 2017 1 0365787
May 23, 2017 (CN) .......................... 2017 1 0370658
Jul. 19, 2017 (CN) .......................... 2017 1 0592117
Aug. 17, 2017 (CN) .......................... 2017 1 0706221
(Continued)

(51) Int. Cl.
*H04K 3/00* (2006.01)
*H05B 37/02* (2006.01)
*F21V 29/504* (2015.01)
*F21V 29/508* (2015.01)
(Continued)

(52) U.S. Cl.
CPC ........... *H05B 37/0209* (2013.01); *F21V 5/04* (2013.01); *F21V 23/005* (2013.01);
(Continued)

(58) Field of Classification Search
None
See application file for complete search history.

(56) References Cited

U.S. PATENT DOCUMENTS

5,777,383 A * 7/1998 Stager ................ G01R 31/2884
257/206
7,338,216 B2 * 3/2008 Burdick ............... H05K 1/0218
385/88
(Continued)

*Primary Examiner* — David C Payne
*Assistant Examiner* — Pranesh K Barua
(74) *Attorney, Agent, or Firm* — Brinks Gilson & Lione (57) ABSTRACT The present disclosure generally relates to optical modules, and in particular, to an optical module comprising a printed circuit board for reducing crosstalk between differential signal lines. In one implementation, the printed circuit board comprises a top layer, a first intermediate signal transmission layer, a second intermediate signal transmission layer, a bottom layer and multiple ground layers between signal transmission layers. Each signal transmission layer comprises one or more differential signal line pairs. The top layer and the bottom layer each comprises an edge connector, and the top layer further comprises a laser driver chip. The signal transmission layers are connected to the edge connectors and laser driver chips via a combination of blind and through connection holes such that the interference between the differential signal line pairs of various signal transmission layers are reduced.

20 Claims, 5 Drawing Sheets (30) Foreign Application Priority Data

| Aug. 22, 2017 | (CN) | .......................... 2017 1 0725586 |
| Sep. 18, 2017 | (CN) | .......................... 2017 1 0842912 |
| Oct. 10, 2017 | (CN) | .......................... 2017 1 0934006 |

(51) Int. Cl.

| F21V 29/83 | (2015.01) |
| F21V 5/04 | (2006.01) |
| F21V 23/00 | (2015.01) |
| G02B 6/42 | (2006.01) |
| H05K 9/00 | (2006.01) |
| H04B 10/40 | (2013.01) |
| H04B 10/50 | (2013.01) |
| H04B 10/85 | (2013.01) |
| H04B 15/02 | (2006.01) |

(52) U.S. Cl.
CPC .......... *F21V 29/504* (2015.01); *F21V 29/508* (2015.01); *F21V 29/83* (2015.01); *G02B 6/4206* (2013.01); *G02B 6/428* (2013.01); *G02B 6/4214* (2013.01); *G02B 6/4246* (2013.01); *G02B 6/4251* (2013.01); *G02B 6/4256* (2013.01); *G02B 6/4274* (2013.01); *G02B 6/4283* (2013.01); *G02B 6/4292* (2013.01); *H04B 10/40* (2013.01); *H04B 10/503* (2013.01); *H04B 10/85* (2013.01); *H04B 15/02* (2013.01); *H05K 9/0058* (2013.01)

(56) References Cited

U.S. PATENT DOCUMENTS

| 2005/0175350 | A1* | 8/2005 | Hartzell | G02B 6/4246 398/135 |
| 2006/0028305 | A1* | 2/2006 | Dutta | H01P 3/084 333/238 |
| 2007/0151758 | A1* | 7/2007 | Dunn | H05K 1/162 174/262 |
| 2008/0250377 | A1* | 10/2008 | Bird | G01R 31/2818 716/137 |
| 2009/0260864 | A1* | 10/2009 | Lee | H05K 1/0236 174/260 |
| 2009/0283299 | A1* | 11/2009 | Suzuki | H05K 1/0207 174/251 |
| 2012/0007688 | A1* | 1/2012 | Zhou | H05K 1/0245 333/4 |
| 2012/0099857 | A1* | 4/2012 | Zhang | H04B 10/07955 398/38 |
| 2013/0287405 | A1* | 10/2013 | Verma | B82Y 20/00 398/137 |
| 2014/0099121 | A1* | 4/2014 | Shiraishi | H04B 10/40 398/115 |
| 2015/0282317 | A1* | 10/2015 | Gonya | H05K 3/403 174/262 |
| 2018/0110149 | A1* | 4/2018 | Guillot | G06F 1/184 |
| 2018/0177042 | A1* | 6/2018 | Kagaya | G02B 6/4284 |

* cited by examiner

FIG. 7

OPTICAL MODULE

CROSS REFERENCES

The present application claims priority to Chinese Patent Application No. 201710934006.X filed on Oct. 10, 2017, Chinese Patent Application No. 201710842912.7 filed on Sep. 18, 2017, Chinese Patent Application No. 201710725586.1 filed on Aug. 22, 2017, Chinese Patent Application No. 201710706221.4 filed on Aug. 17, 2017, Chinese Patent Application No. 201710592117.7 filed on Jul. 19, 2017, Chinese Patent Application No. 201710370658.5 filed on May 23, 2017, Chinese Patent Application No. 201710365787.5 filed on May 17, 2017, and Chinese Patent Application No. 201710220900.0 filed on Apr. 6, 2017, which are herein incorporated by reference in their entireties.

The present application further is relevant to the following four (4) U.S. patent applications, filed concurrently with the present application, the entireties of which are hereby incorporated by reference: U.S. patent application Ser. No. 15/857,884, entitled "Optical Module," filed Dec. 29, 2017; U.S. patent application Ser. No. 15/857,942, entitled "Optical Module," filed Dec. 29, 2017; U.S. patent application Ser. No. 15/857,987, entitled "Optical Module," filed Dec. 29, 2017; and U.S. patent application Ser. No. 15/857,958, entitled "Optical Module," filed Dec. 29, 2017.

BACKGROUND

Technical Field

The present disclosure relates to the field of optical modules, and in particular, to an optical module.

Related Art

Optical modules have become an essential part of electronic and optoelectronic devices in communications systems. Printed circuit boards are important part of an optical module, and are used to hold and connect electronic and optoelectronic components. With the development of electronic fabrication technologies, wiring density in printed circuit boards has become increasingly higher, and printed circuit boards has become more complex. Higher wiring density in a printed circuit board may cause increased crosstalk between electric signals including differential signals during their processing and transmission.

Differential signal transmission technology differs from a conventional signal transmission method. In conventional signal transmission, an electric signal is transmitted on a single signal line and a reference ground line. In differential signal transmission, a signal is transmitted on two differential lines as differential signals. The differential signals have the same amplitude but opposite phases and polarities. With limited space and high wiring density on a printed circuit board, crosstalk may be generated between pairs of differential signals. Crosstalk represents noises caused by a capacitive or inductive coupling between signal lines. Crosstalk degrades signal integrity. As such, reducing crosstalk between electric transmission lines and signals is essential for ensuring signal integrality. Differential signals are particularly sensitive to crosstalk. Large crosstalk causes loss of information during transmission, leading to a high transmission bit error rate.

BRIEF DESCRIPTION OF THE DRAWINGS

The accompany drawings below describe the technical solutions of embodiments of the present disclosure.

SUMMARY

This disclosure is related to reducing interference between differential signal lines in an optical module.

In one implementation, an optical module is disclosed. The optical module includes a printed circuit board. The printed circuit board comprises a top layer, a first intermediate signal transmission layer, a second intermediate signal transmission layer, and a bottom layer. The top layer and the bottom layer are signal transmission layers. Each signal transmission layer is associated with an adjacent ground layer, forming multiple ground layers. Each signal transmission layer comprises one or more differential signal line pairs. The first intermediate signal transmission layer is located between the top layer and the second intermediate signal transmission layer. The second intermediate signal transmission layer is located between the first intermediate signal transmission layer and the bottom layer. The top layer and the bottom layer each comprises an edge connector, and the top layer further comprises a laser driver chip. One end of the first intermediate signal transmission layer is connected to the laser driver chip through a first blind connection hole, and the other end of the first intermediate signal transmission layer is connected to the edge connector on the top layer through a second blind connection hole. One end of the second intermediate signal transmission layer is connected to the laser driver chip through a third blind connection hole, and the other end of the second intermediate signal transmission layer is connected to the edge connector on the bottom layer through a fourth blind connection hole. The bottom layer is connected to the laser driver chip through a through connection hole.

In another implementation, the at least one of the blind connection holes and the through connection hole above is provided with at least four ground connection holes connected to at least one of the multiple ground layers, the at least four ground connection holes form a U shape around the at least one of the blind connection holes and the through connection hole.

In another implementation, the at least one of the signal transmission layers above comprises a signal receiving area and a signal transmission area. The signal receiving area and the signal transmission area are respective located on spatially separated. The differential signal line pairs of the at least one of the signal transmission layers comprise differential signal receiving line pairs and differential signal transmission line pairs. The differential signal receiving line pairs are disposed in the signal receiving area, and the differential signal transmission line pairs are disposed in the signal transmission area.

In another implementation, the top layer is further provided with a coupling capacitor, and the first intermediate signal transmission layer and the second intermediate signal transmission layers are connected to the laser driver chip via the coupling capacitor.

In yet another implementation, the printed circuit board above comprises 8 layers and 16 differential signal line pairs. The 8 layers of the printed circuit board comprise the top layer, a first ground layer, the first intermediate signal transmission layer, a second ground layer, a third ground layer, the second intermediate signal transmission layer, a fourth ground layer, and the bottom layer. The first intermediate signal transmission layer comprises two differential signal receiving line pairs and two differential signal transmission line pair. The first intermediate signal transmission layer comprises a signal receiving area and a signal transmission area. The two differential signal receiving line pairs are disposed in the signal receiving area of the first intermediate signal transmission layer. The two differential signal transmission line pairs are disposed in the transmission area of the first intermediate signal transmission layer.

DETAILED DESCRIPTION

Differential transmission is a signal transmission technology using a pair of transmission lines. A pair of signals are transmitted on two lines. The two signals have an equal amplitude but opposite phase and polarities. A differential signal technique may help transmit electric signal of small amplitudes, possess high immunity to external electromagnetic interference, and can precisely process a difference between the pair of signals of two polarities.

In one implementation of the present disclosure, an optical module is provided, including a printed circuit board. The printed circuit board includes a top layer, a first intermediate signal transmission layer, a second intermediate signal transmission layer, and a bottom layer. The top layer and the bottom layer are also signal transmission layers. Each signal transmission layer may be further associated with an adjacently stacked ground layer. One of more signal transmission layers are provided with differential signal line pairs. The first intermediate signal transmission layer is located between the top layer and the second intermediate signal transmission layer and the second intermediate signal transmission layer is located between the top layer and the bottom layer. The top layer and the bottom layer are each provided with an edge connector. The top layer further includes a laser driver chip. One end of the first intermediate signal transmission layer is connected to the laser driver chip through a blind connection hole, and the other end of the first intermediate signal transmission layer is connected to the edge connector on the top layer through another blind connection hole. One end of the second intermediate signal transmission layer is connected to the laser driver chip through a blind connection hole, and the other end of the second intermediate signal transmission layer is connected to the edge connector on the bottom layer through another blind connection hole. One end of the bottom layer is connected to the laser driver chip through a through connection hole.

In this implementation of the present disclosure, each signal transmission layer is associated with an adjacently stacked ground layer. Therefore, each signal transmission layer is shielded by ground layers, thereby reducing crosstalk that may be present when two signal transmission layers are directly adjacent to each other without any ground layer in between.

Further, the intermediate signal transmission layers are connected to the edge connector and the laser driver chip through the blind connection holes. Crosstalk between differential signal lines can be reduced by using blind connection holes. In addition, the first intermediate signal transmission layer is connected to the edge connector on the top layer, and the second intermediate signal transmission layer is connected to the edge connector on the bottom layer. Therefore, interference and crosstalk between differential signal line pairs in the first intermediate signal transmission layer and differential signal line pairs in the second intermediate signal transmission layer is reduced. Moreover, when the first intermediate signal transmission layer is connected to the edge connector on the top layer, no hole needs to be punched through the second signal transmission layer. Likewise, when the second signal transmission layer is connected to the edge connector on the bottom layer, no hole needs to be punched through the first signal transmission layer. In this way, crosstalk between the differential signal line pairs in the first and second intermediate signal transmission layers may be reduced, and data transmission accuracy may be improved. In addition, because the amount of through holes are minimized, mechanical strength of the printed circuit board is improved.

In some implementation, two printed circuit boards may be connected to each other generally by using an edge connector on one of the two printed circuit boards and a corresponding edge socket on the other of the two printed circuit boards. The edge connector may include a plurality of exposed copper pads. These copper pads are a part of and extend from the wiring of the printed circuit board. During normal connection, an edge connector on one printed circuit board is inserted into the corresponding edge socket on the other printed circuit board. The printed circuit boards may be connected to outside circuits by using additional edge connectors.

In some implementation, the top layer is further provided with a coupling capacitor, and the signal transmission layer is connected to the laser driver chip via the coupling capacitor. Disposing the coupling capacitor between the laser driver chip and the signal lines may further help reducing signal interference from the printed circuit board. In particular, routing of differential signal lines, connection points at connection pins and other locations on the printed circuit board may cause relatively large parasitic inductance. Consequently, high frequency ripples and glitches may be induced in a signal waveform. Placing a coupling capacitor between differential signal lines and the laser driver chip can effectively filter out these high frequency ripples and glitches.

In one implementation of the present disclosure, differential signal line pairs disposed on the top layer may be directly connected to the edge connector on the top layer, and the differential signal line pairs of the top layer are connected to the laser driver chip of the top layer via the coupling capacitor. The differential signal line pairs provided on the bottom layer may be directly connected to the edge connector on the bottom layer.

In one implementation, after a laminated structure of the printed circuit board and the routing of the differential signal line pairs on the signal transmission layers are determined, interconnection between various signal transmission layers may be achieved using connection holes. In particular, identifiers for various parts of the electrical layers may be determined. When a connection hole is punched through the layers, connection between the layers can be made by copper plating without corrosion.

Figure 1:
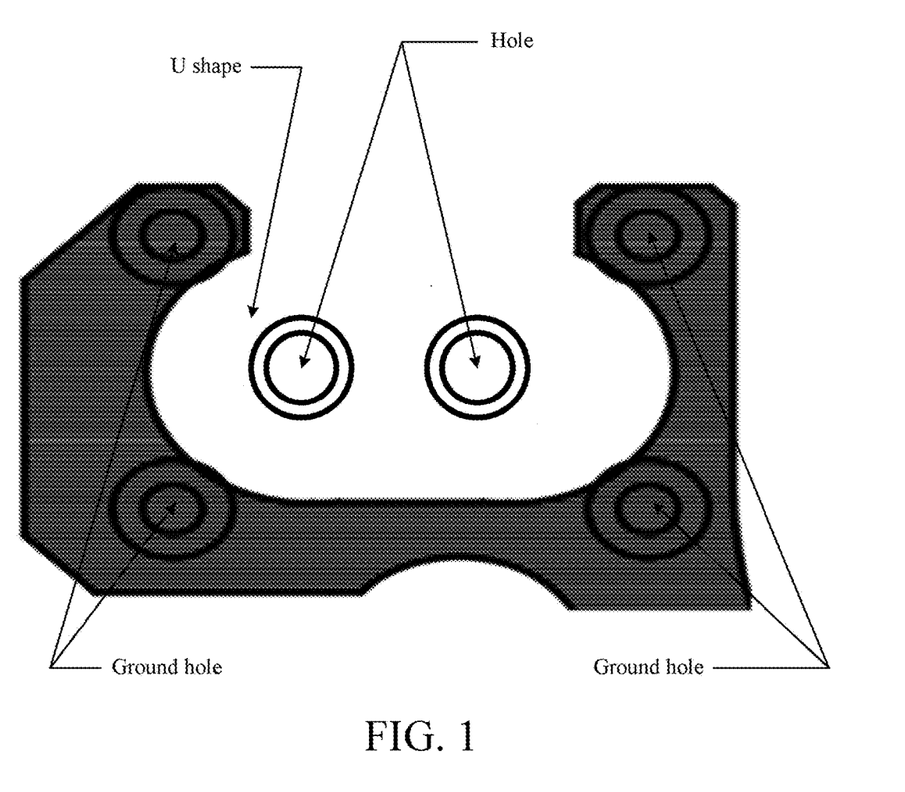
FIG. 1 is a schematic structural diagram showing at least four ground holes formed around electric connection holes according to an embodiment of the present disclosure.

In one implementation for further reducing crosstalk between the differential signal line pairs, one or more blind connection holes or a through connection holes on the signal transmission layer may be provided with at least four ground holes. The at least four ground holes may be arranged around the one or more blind or through connection holes in a U shape. The ground holes are connected to at least one of the ground layers. FIG. 1 is a schematic structural diagram of connection holes provided with at least four ground holes according to an embodiment of the present disclosure. As shown in FIG. 1, there are four ground holes arranged around the connection holes, and the four ground holes form a U shape. The connection holes in FIG. 1 include a through connection hole and a blind connection hole. In this implementation of the present disclosure, the connection holes are surrounded by a ground signal from the ground holes. As such, the connection holes are isolated from other signal lines around them by ground. Crosstalk and interference caused by parasitic capacitance and parasitic inductance inherent to the connection holes may be reduced, thereby further decreasing a crosstalk between differential signal lines.

In the implementations of the present disclosure, a difference between two complementary differential signals of a pair of differential lines that are references of each other are read/measured to determine a transmitted signal by the pair of differential lines. Because some noises or interferences affects both differential lines of the differential line pair in similar ways, measuring a differential signal between the differential line pair help reduce such noises and interferences. To obtain optimal noise reduction, the two signal lines of the differential signal line pair may be designed with an equal length and of a same type, spatially close to each other, and are a same signal transmission layer. In some implementation, there may be N pairs of differential signal lines carrying N pairs high-speed differential signals.

To further reduce crosstalk between electric signals, in some implementations of the present disclosure, a signal transmission layer may include a signal receiving area and a signal transmission area. The signal receiving area and the signal transmission area of a signal transmission layer may be separated and may be respectively located on a left side and a right side of the signal transmission layer. The differential signal line pairs routed in the signal transmission layer may include a group of differential signal receiving line pairs and a group of differential signal transmission line pairs. The differential signal receiving line pairs may be disposed and routed in the signal receiving area of the signal transmission layer and the differential signal transmission line pairs may be disposed in the signal transmission area of the signal transmission layer.

In one implementation, when an amplitude of a signal transmitted by a differential signal receiving line is very small and the differential signal transmission line is transmitting a high-frequency modulated signal, the transmitted high-frequency modulated signal may affect the sensitivity of the received small-amplitude signal. By routing and distributing received differential signal and a transmitted differential signal in different areas of the signal transmission layer, crosstalk between the received differential signal and the transmitted differential signal may be reduced.

In one implementation of the present disclosure, the differential signal receiving line pairs may be evenly distributed on various signal receiving areas of the signal transmission layers, and the differential signal transmission line pairs may also be evenly distributed on various signal transmission areas of the signal transmission layers. In some implementation, for a high frequency signal and some critical signals, such as clock signals, differential signal lines may be as wide as possible, and may be isolated from another signal line. Differential signal receiving line pairs and differential signal transmission line pairs are evenly distributed on transmitting and receiving areas of each signal transmission layer. Each pair of differential signal lines may be as wide as possible on the printed circuit board even though the printed circuit board may have limited space, and a pair of differential signal lines may be kept relatively distant from another differential signal line pair.

Figure 2:
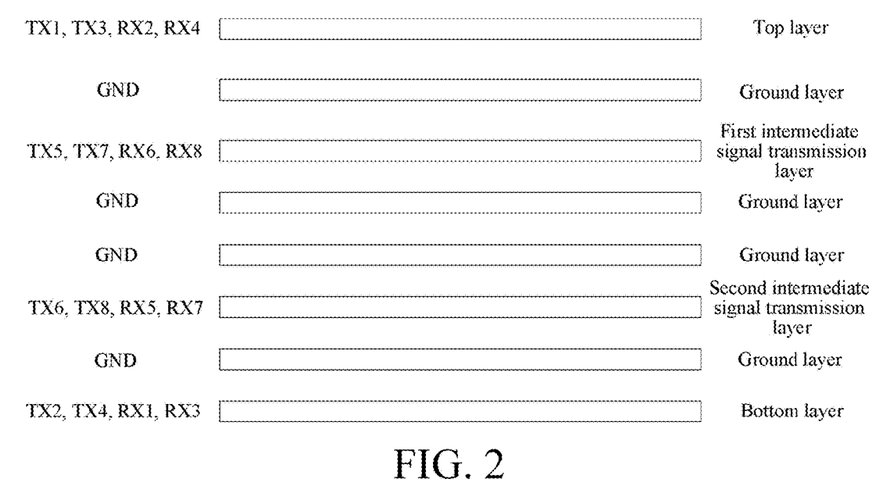
FIG. 2 is a schematic structural diagram of a printed circuit board according to an embodiment of the present disclosure.

FIG. 2 shows a printed circuit board according to an implementation of the present disclosure discussed above. The example of printed circuit board of FIG. 2 includes 8 layers and 16 pairs of differential signal lines. As shown in FIG. 2, the 8 layers of the printed circuit board include a top layer, a ground layer, a first intermediate signal transmission layer, another ground layer, another ground layer, a signal transmission layer, another ground layer, and a bottom layer. The top layer and the bottom layer are also signal transmission layers. Each signal transmission layer is provided with, e.g., four pairs of differential signal lines. The four pairs of differential signal lines include two pairs of differential signal receiving lines and two pairs of differential signal transmission lines. Each pair of differential signal receiving lines is identified with RX, and each pair of differential signal transmission lines is identified with TX. Each pair of differential signal receiving lines is disposed in a receiving area of each signal transmission layer, and each pair of differential signal transmission lines is disposed in a transmission area of each signal transmission layer. In the example of FIG. 2, the receiving area and the transmission area of a signal transmission layer are respectively disposed on the left aide and the right side of the signal transmission layer. Differential signal line pairs disposed on the top layer include, for example, TX1, TX3, RX2, and RX4. Differential signal line pairs disposed on the first intermediate signal transmission layer include TX5, TX7, RX6, and RX8. Differential signal line pairs disposed on the second intermediate signal transmission layer include TX6, TX8, RX5, and RX7. Differential signal line pairs disposed on the bottom layer include TX2, TX4, RX1, and RX3. Ground layers associated with the signal transmission layers are represented as GND.

In one implementation of the present disclosure, the first intermediate signal transmission layer and the second intermediate signal transmission layer are each associated with an independent ground layer. That is, there may be two ground layers between the first intermediate signal transmission layer and the second intermediate signal transmission layer (as shown in FIG. 2). Copper planes of the two ground layers may provide electromagnetic shielding for signals transmitted in the intermediate signal transmission layers. They may further effectively restrict signal radiation to between the two ground layers, reducing interference to the outside, and may additionally reduce common-mode interference.

Figure 3:
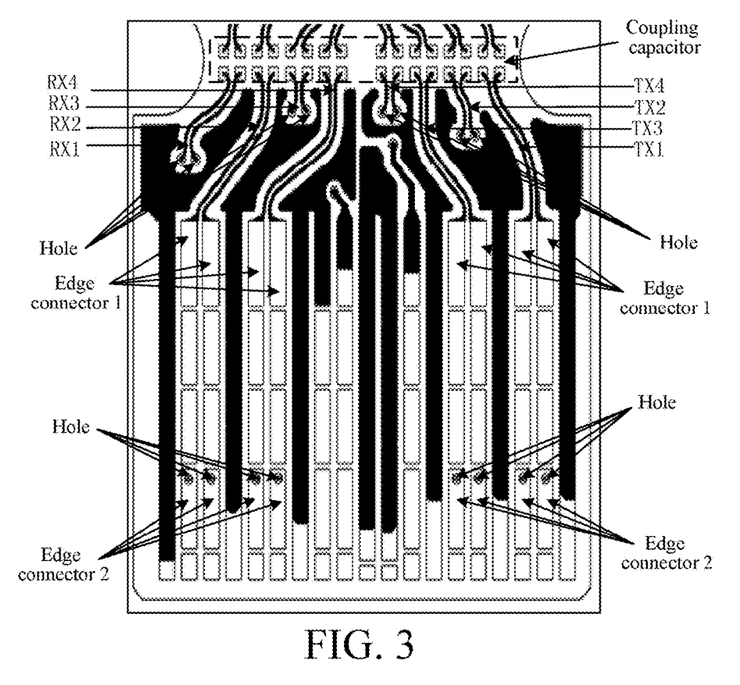
FIG. 3 is a schematic structural diagram of a top layer of a printed circuit board according to an embodiment of the present disclosure.

FIG. 3 is a schematic structural diagram of a top layer of an exemplary printed circuit board according to an embodiment of the present disclosure and based on the layer structure of FIG. 2. In FIG. 3, differential signal line pairs disposed on the top layer include TX1, TX3, RX2, and RX4. As shown in FIG. 3, the top layer is provided with edge connectors, coupling capacitors, and connection holes. The edge connectors include an edge connector 1 connected to the differential signal lines TX1, TX3, RX2, and RX4 on the top layer and an edge connector 2 connected to differential signal lines on the first intermediate signal transmission layer. One ends of the coupling capacitors are connected to ends of differential signal line pairs. The other ends of the coupling capacitors are connected to a laser driver chip. Connection holes on the top layer are configured to connect differential signal lines below the top layer to the coupling capacitors. FIG. 3 shows an example of connecting differential signal lines TX2, TX4, RX1, and RX3 on the bottom layer to the coupling capacitor via through connection holes. As shown in FIG. 3, the differential signal lines TX2, TX4, RX1, and RX3 on the bottom layer are connected with the top layer through the through connection holes, and then are connected to the coupling capacitors by a conducting line at the positions of the through connection holes on the top layer. The differential signal lines on the bottom layer are thus connected to the coupling capacitors on the top layer.

Figure 4:
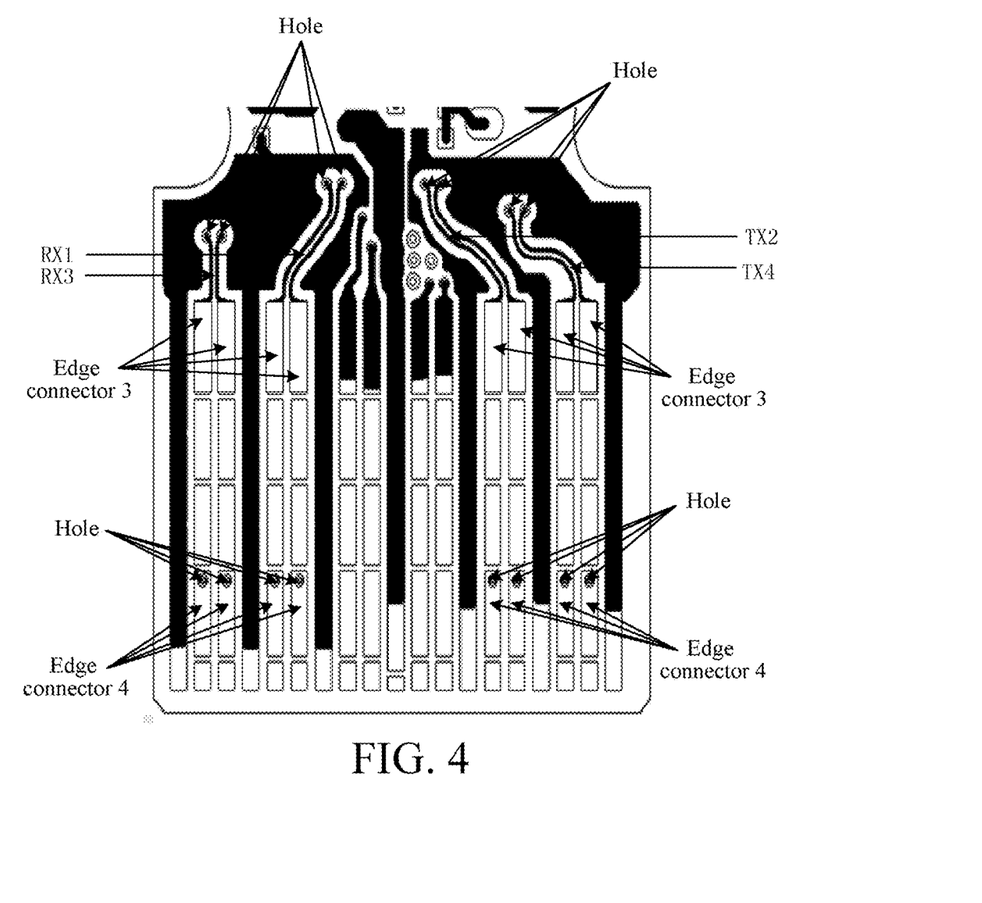
FIG. 4 is a schematic structural diagram of a bottom layer of a printed circuit board according to an embodiment of the present disclosure.

FIG. 4 is a schematic structural diagram of the bottom layer of the printed circuit board of FIG. 3. In the example of FIG. 4, differential signal lines disposed on the bottom layer include TX2, TX4, RX1, and RX3. As shown in FIG. 4, the bottom layer is provided with edge connectors and connection holes. The edge connectors include an edge connector 3 connected to the differential signal lines TX2, TX4, RX1, and RX3 on the bottom layer and an edge connector 4 connected to differential signal lines on the second intermediate signal transmission layer. The differential signal lines TX2, TX4, RX1, and RX3 on the bottom layer are connected to the coupling capacitor on the top layer shown in FIG. 3 via through connection holes. Connection holes on the edge connector 4 are configured to connect the edge connector 4 to the differential signal lines on the second intermediate signal transmission layer. The differential signal lines on the second intermediate signal transmission layer are connected to the edge connector 4 on the bottom layer through such connection holes. These connections holes may be blind connection holes.

Figure 5:
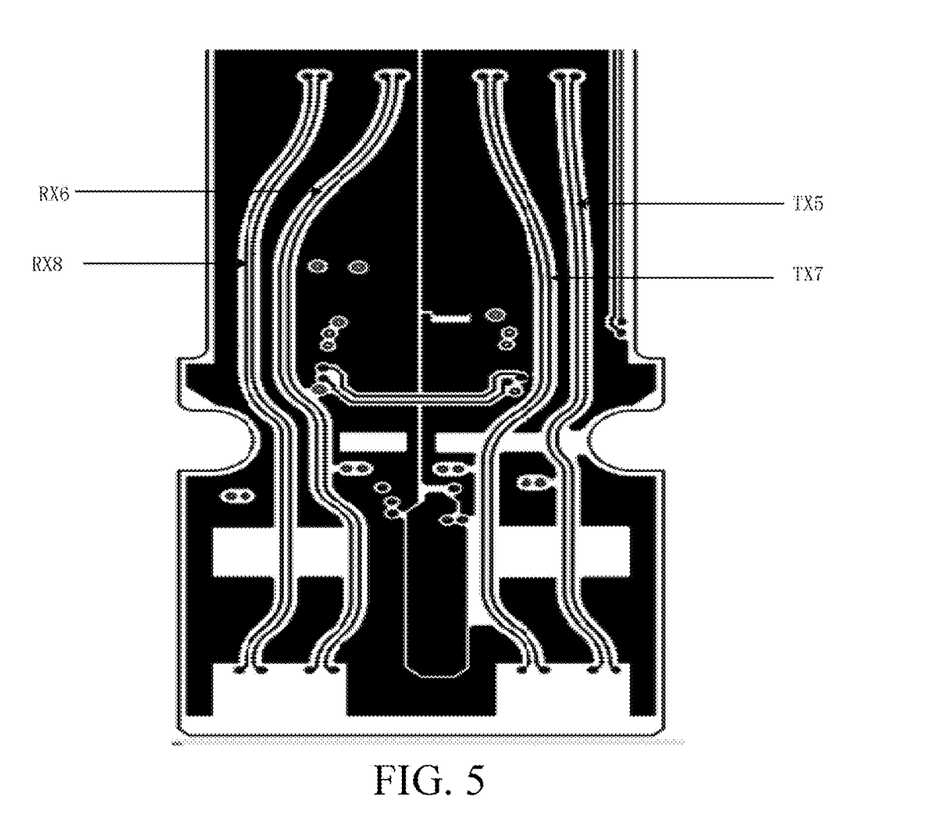
FIG. 5 is a schematic structural cross-sectional view of a first intermediate signal transmission layer according to an embodiment of the present disclosure.

FIG. 5 is a schematic structural cross-sectional view of the first intermediate transmission layer of the printed circuit board of FIG. 3 and FIG. 4. As shown in the example of FIG. 5, differential signal lines TX5, TX7, RX6, RX8 are disposed on the first intermediate transmission layer. The differential received signal lines RX6 and RX8 are disposed at the left side of the first intermediate signal transmission layer. The differential signal transmission lines TX5 and TX7 are disposed on the right side of the first intermediate signal transmission layer. In this implementation of the present disclosure, on the second intermediate signal transmission layer, the differential signal lines disposed at the left side are RX5 and RX7, and the differential signal lines disposed at the right side are TX6 and TX8. The remaining structure of the second intermediate signal transmission layer is similar to that of the first intermediate signal transmission layer.

Figure 6:
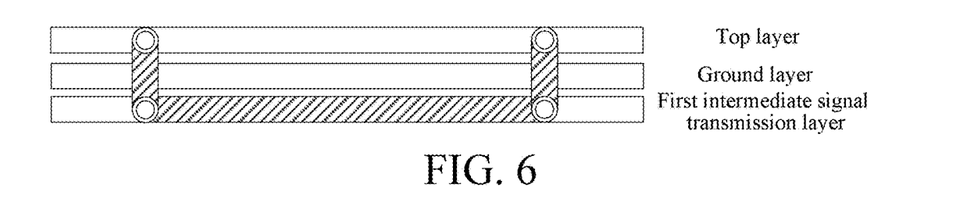
FIG. 6 is a schematic diagram of showing a connection between a differential signal line on a first intermediate signal transmission layer and an edge connector and a coupling capacitor on a top layer of a printed circuit board according to an embodiment of the present disclosure.

FIG. 6 is a schematic diagram for a connection between a differential signal line in the first intermediate signal transmission layer and an edge connector and a coupling capacitor on the top layer according to an embodiment of the present disclosure. As shown in FIG. 6, one end of the differential signal line in the first intermediate signal transmission layer is connected to the edge connector on the top layer through a blind connection hole, and the other end of the differential signal line in the first intermediate signal transmission layer is connected the coupling capacitor on the top layer also through a blind connection hole.

Figure 7:
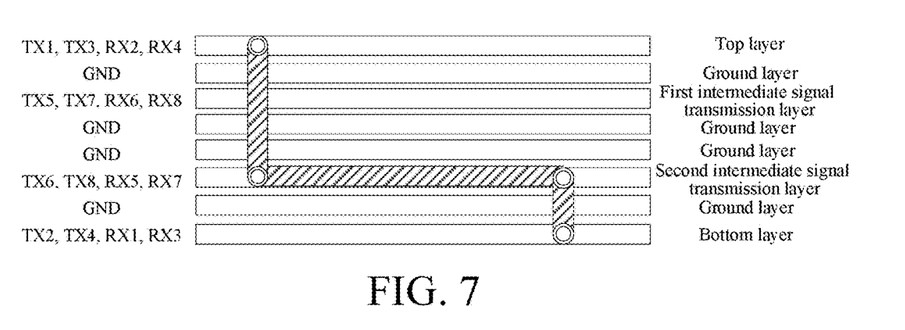
FIG. 7 is a schematic diagram showing a connection between differential signal lines on a second intermediate signal transmission layer and an edge connector on a bottom layer and a coupling capacitor on a top layer of a printed circuit board.

FIG. 7 is a schematic diagram for a connection between differential signal lines in the second intermediate signal transmission layer and an edge connector on the bottom layer and a coupling capacitor on the top layer. As shown in FIG. 7, ends of the differential signal lines in the second intermediate signal transmission layer are connected to the edge connector on the bottom layer through blind connection holes, and the other ends of the differential signal lines in the second intermediate signal transmission layer are connected the coupling capacitor on the top layer through blind connection holes.

In the implementations of the present disclosure, after wiring is completed, a large scale of ground copper planes, also referred to as plated copper, should be plated on the area of the top layer and the bottom layer having no differential signal lines, to reduce resistance of the ground, to weaken high frequency components in the ground, and to suppress electromagnetic interference.

As can be seen from the foregoing description and implementations, a signal transmission layer is associated with an adjacent stacked ground layer. As a result, the signal transmission layer is shielded by the ground layer, thereby reducing crosstalk between signal transmission layers.

Further, intermediate signal transmission layers are connected to an edge connector and a laser driver chip through blind connection holes. Crosstalk between differential signal lines can be reduced by using such blind holes. In addition, the first intermediate signal transmission layer is connected to an edge connector on the top layer, and the second intermediate signal transmission layer is connected to an edge connector on the bottom layer. Therefore, differential signal line pairs in the first intermediate signal transmission layer may not couple via any through connection holes. As such, crosstalk between the differential signal line pairs in the first intermediate signal transmission layer and the differential signal line pairs in the second signal transmission layer is reduced. Moreover, when the first intermediate signal transmission layer is connected to the edge connector, no hole needs to be punched through the second intermediate signal transmission layer. Likewise, when the second intermediate signal transmission layer is connected to the edge connector, no hole needs to be punched through the first intermediate signal transmission layer. In this way, crosstalk between the differential signal line pairs in the first intermediate signal transmission layer and the second intermediate transmission layer is reduced. Data transmission accuracy is therefore improved. In addition, mechanical strength of a printed circuit board is improved by avoiding many through connection holes.

Persons skilled in the art should understand that the implementations of the present disclosure may be provided as a method or a computer program product. Therefore, the present disclosure may be implemented as a hardware, a software, or a combination of software and hardware. Moreover, the present disclosure may be implemented as a non-transitory computer program product in the form of one or more computer-readable storage media (including but not limited to a disk memory, a compact disc read-only memory (CD-ROM), an optical memory, and the like) for storing computer instructions.

The present disclosure is described with reference to various flowcharts and/or block diagrams of the method, the device (system), and the computer program product according to the embodiments of the present disclosure. It should be understood that computer instructions may be used to implement each process and/or each block in the flowcharts and/or the block diagrams and a combination of a process and/or a block in the flowcharts and/or the block diagrams. These computer instructions may be provided for execution by a general-purpose computer, a dedicated computer, an embedded processor, or a processor of any other programmable data processing device. The combination of these computing devices and the computer instructions generates a machine, or an apparatus for implementing specific functions of one or more processes in the flowcharts and/or in one or more blocks in the block diagrams.

These computer instructions may be stored in a computer readable memory that can instruct the computer or any other programmable data processing device to work in a specific manner, so that the instructions stored in the computer readable memory generate an artifact that includes an instruction apparatus of a module. The instruction apparatus or module may implement a specific function of one or more processes in the flowcharts and/or in one or more blocks in the block diagrams.

These computer instructions may be loaded into a computer or another programmable data processing device, so that a series of operations and steps are performed on the computer or the another programmable device, thereby generating computer-implemented processes. Therefore, the instructions executed on the computer or the another programmable device provide steps for implementing a specific function in one or more processes in the flowcharts and/or in one or more blocks in the block diagrams.

Although some exemplary implementations of the present disclosure have been described, persons of ordinary skill in the art can make changes and modifications to these embodiments once they understand the basic inventive concept. Therefore, the following claims are intended to be construed as to cover the described implementations and all changes and modifications falling within the scope of the present disclosure.

Persons of ordinary skill in the art can make various modifications and variations to the present disclosure without departing from the spirit and scope of the present disclosure. The present disclosure is intended to cover these modifications and variations provided that they fall within the scope of protection defined by the following claims and their equivalents.

What is claimed is:

1. An optical module, comprising a printed circuit board, the printed circuit board comprising:
   a top signal transmission layer;
   a first intermediate signal transmission layer;
   a second intermediate signal transmission layer; and
   a bottom signal transmission layer,
   wherein:
      each signal transmission layer is associated with at least one of an adjacent ground layer among a plurality of ground layers;
      each signal transmission layer comprises one or more differential signal line pairs;
      the first intermediate signal transmission layer is located between the top signal transmission layer and the second intermediate signal transmission layer;
      the second intermediate signal transmission layer is located between the first intermediate signal transmission layer and the bottom signal transmission layer;
      the top signal transmission layer and the bottom signal transmission layer each comprises an edge connector the top transmission layer is further mounted with a laser driver chip;
      one end of the first intermediate signal transmission layer is connected to the laser driver chip through a first blind connection hole, and the other end of the first intermediate signal transmission layer is connected to the edge connector on the top signal transmission layer through a second blind connection hole;
      one end of the second intermediate signal transmission layer is directly connected to the laser driver chip through a single third blind connection hole, and the other end of the second intermediate signal transmission layer is directly connected to the edge connector on the bottom signal transmission layer through a single fourth blind connection hole; and
      the bottom signal transmission layer is connected to the laser driver chip by a through connection hole.

2. The optical module according to claim 1, wherein at least one of the blind connection holes and the through connection hole is provided with at least four ground connection holes connected to at least one of the plurality of ground layers, the at least four ground connection holes form a U shape around the at least one of the blind connection holes and the through connection hole.

3. The optical module according to claim 1, wherein:
   at least one of the signal transmission layers comprises a signal receiving area and a signal transmission area;
   the signal receiving area and the signal transmission area are respective located on spatially separated; and
   the differential signal line pairs of the at least one of the signal transmission layers comprise differential signal receiving line pairs and differential signal transmission line pairs; and
   the differential signal receiving line pairs are disposed in the signal receiving area, and the differential signal transmission line pairs are disposed in the signal transmission area.

4. The optical module according to claim 1, wherein the top signal transmission layer is further provided with a coupling capacitor, and wherein the first intermediate signal transmission layer and the second intermediate signal transmission layers are connected to the laser driver chip via the coupling capacitor.

5. The optical module according to claim 1, wherein:
   the printed circuit board comprises 8 layers
   the 8 layers of the printed circuit board comprise: the top signal transmission layer, a first ground layer, the first intermediate signal transmission layer, a second ground layer, a third ground layer, the second intermediate signal transmission layer, a fourth ground layer, and the bottom signal transmission layer;
   the first intermediate signal transmission layer comprises two differential signal receiving line pairs and two differential signal transmission line pair;
   the first intermediate signal transmission layer comprises a signal receiving area and a signal transmission area;

the two differential signal receiving line pairs are disposed in the signal receiving area of the first intermediate signal transmission layer; and the two differential signal transmission line pairs are disposed in the transmission area of the first intermediate signal transmission layer.

6. The optical module according to claim 3, wherein the differential signal receiving line pairs are evenly distributed in the signal receiving area and the differential signal transmission line pairs are evenly distributed in the signal transmission area.

7. The optical module according to claim 1, wherein the top signal transmission layer is further provided with a coupling capacitor, and wherein the bottom signal transmission layer is connected to the laser driver chip via the coupling capacitor using the through connection hole.

8. The optical module according to claim 4, wherein the first intermediate signal transmission layer and the second intermediate signal transmission layer are connected to the laser driver chip via the coupling capacitor using the first blind connection hole and the third blind connection hole, respectively.

9. The optical module according to claim 4, wherein the bottom signal transmission layer is connected to the laser driver chip via the coupling capacitor using the through connection hole.

10. The optical module according to claim 1, wherein the printed circuit board comprises at least 8 layers comprising the top signal transmission layer, a first ground layer, the first intermediate signal transmission layer, a second ground layer, a third ground layer, the second intermediate signal transmission layer, a fourth ground layer, and the bottom signal transmission layer.

11. The optical module according to claim 1 wherein the top signal transmission layer and the bottom signal transmission layer are copper plated in areas thereof having no differential signal line pairs.

12. The optical module according to claim 1, wherein at least one of the blind connection holes and the through connection hole is surrounded by a plurality of connection holes connected to at least one of the plurality of ground layers.

13. The optical module according to claim 1, wherein each of the one or more differential signal line pairs are routed along substantially similar path length, signal line width, and close spatial proximity.

14. The optical module according to claim 1, wherein the one or more differential signal line pairs on the top signal transmission layer are directly connected to the edge connector of the top signal transmission layer, and the one or more differential signal line pairs on the bottom signal transmission layer are directly connected to the edge connector of the bottom signal transmission layer.

15. The optical module according to claim 1, wherein at least a pair of connection holes among the blind connection holes and the through connection hole are surrounded with at least four common ground connection holes connected to at least one of the plurality of ground layers.

16. The optical module according to claim 15, wherein the at least four common ground connection holes form a U shape around the at least a pair of connection holes.

17. The optical module according to claim 1, wherein the first intermediate signal transmission layer comprises two differential signal receiving line pairs and two differential signal transmission line pairs.

18. The optical module according to claim 17, wherein:
the first intermediate signal transmission layer comprises a first signal receiving area and a first signal transmission area separate from the first signal receiving area;
the two differential signal receiving line pairs are disposed in the first signal receiving area of the first intermediate signal transmission layer; and
the two differential signal transmission line pairs are disposed in the first signal transmission area of the first intermediate signal transmission layer.

19. The optical module according to claim 18, wherein the second intermediate signal transmission layer comprises two differential signal receiving line pairs and two differential signal transmission line pairs other than the two different signal receiving line pairs and two differential signal transmission line pairs in the first intermediate signal transmission layer.

20. The optical module according to claim 1, wherein the second intermediate signal transmission layer comprises two differential signal receiving line pairs and two differential signal transmission line pairs.

* * * * *